US008680584B2

(12) United States Patent
Brand

(10) Patent No.: US 8,680,584 B2
(45) Date of Patent: Mar. 25, 2014

(54) MOS TRANSISTOR STRUCTURE WITH EASY ACCESS TO ALL NODES

(75) Inventor: Joerg Brand, Emmering (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 391 days.

(21) Appl. No.: 12/806,092

(22) Filed: Aug. 5, 2010

(65) Prior Publication Data
US 2011/0316053 A1    Dec. 29, 2011

(30) Foreign Application Priority Data

Jun. 24, 2010 (EP) .................................. 10392005

(51) Int. Cl.
*H01L 27/118* (2006.01)
(52) U.S. Cl.
USPC .................................. 257/206; 257/E27.062
(58) Field of Classification Search
USPC .......... 257/202, 204, 206, 208, 369, E27.108, 257/E27.06, E27.062
See application file for complete search history.

(56) References Cited

U.S. PATENT DOCUMENTS

| 5,355,008 | A | 10/1994 | Moyer et al. | |
| 7,255,217 | B2 * | 8/2007 | Novacek et al. | 198/337 |
| 7,355,217 | B1 * | 4/2008 | Brand | 257/202 |
| 7,414,275 | B2 | 8/2008 | Greenberg et al. | |
| 2005/0250300 | A1 * | 11/2005 | Fong | 438/597 |
| 2006/0278931 | A1 | 12/2006 | Lee et al. | |
| 2008/0157195 | A1 | 7/2008 | Sutardja et al. | |
| 2008/0157226 | A1 | 7/2008 | Majcherczak et al. | |
| 2009/0315080 | A1 | 12/2009 | Stribley et al. | |

FOREIGN PATENT DOCUMENTS

WO    WO 03/094242    11/2003

OTHER PUBLICATIONS

European Search Report 10392005.4-2203 Mail Date—Oct. 26, 2010, Dialog Semiconductor GmbH.

* cited by examiner

*Primary Examiner* — Vongsavanh Sengdara
(74) *Attorney, Agent, or Firm* — Saile Ackerman LLC; Stephen B. Ackerman; Rosemary L. S. Pike

(57) ABSTRACT

A transistor device structured such that the bulk, gate, drain, and source are all accessible from all four edges of the device and such that current distribution is uniform over the device is provided. The transistor is created with a four-metal CMOS process. A bulk connection can be made with Metal 1, which is all around the device. A gate connection can be made with Metal 2, which is all around the device. Additionally, a drain/source connection can be made with Metal 3, which is all around the device. A source/drain connection can be made with Metal 4, which is all around the device. Source/drain connections are made with two or more evenly distributed via stripes to connect the source/drain parts of the transistor fingers. The transistor structure may be used to create an array of transistors for a high power output stage, with the transistors arranged in a checkerboard pattern. The connections of each transistor are automatic by abutting edges of the transistors.

7 Claims, 9 Drawing Sheets

MOS TRANSISTOR STRUCTURE WITH EASY ACCESS TO ALL NODES

BACKGROUND OF THE INVENTION (1) Field of the Invention

The invention relates to transistors, and more particularly, to a structure suitable for high current transistor devices including an array of output transistors in which the source, drain, gate, and bulk of each of the output transistors in the array is accessible from all four edges of the transistor and in which good current distribution is achieved.

(2) Description of the Related Art

Related U.S. Pat. No. 7,355,217, invented by the same inventor as the current invention and assigned to the same assignee, is hereby incorporated by reference in its entirety. The transistor structure of the referenced patent may be used to create large arrays of high current transistor devices very quickly in terms of the connections between the nodes of a big transistor device because all the connections between bulk, gate, drain and source are done automatically by only abutting the transistor cells. Unfortunately the current distribution inside the single pieces of the array is not even. It is desired to improve the transistor structure in order to get a better current distribution.

A search of the patent literature revealed U.S. Pat. Nos. 7,414,275 to Greenburg et al and 5,355,008 to Moyer et al and US Patent Application 2009/0315080 to Stribley et al. These references show various metal connections between sources and drains, but do not show connections to all of the bulk, gate, source, and drain with even current distribution.

SUMMARY OF THE INVENTION

A principal object of the present invention is to provide an array of output transistors in which the source, drain, gate, and bulk of each of the output transistors in the array is accessible from all four edges.

In accordance with the objects of this invention, a transistor device structured such that the bulk, gate, drain, and source are all accessible from all four edges of the device is provided. The transistor is created with a four-metal CMOS process. A bulk connection can be made with Metal1, which is all around the device. A gate connection can be made with Metal2, which is all around the device. Additionally, a drain/source connection can be made with Metal3, which is all around the device. A source/drain connection can be made with Metal4, which is all around the device. Source/drain connections are made with two or more evenly distributed via stripes to connect the source/drain parts of the transistor fingers. The transistor structure may be used to create an array of transistors for a high power output stage, with the transistors arranged in a checkerboard pattern. The connections of each transistor are automatic by abutting edges of the transistors.

BRIEF DESCRIPTION OF THE DRAWINGS

In the accompanying drawings forming a material part of this description, there is shown.

DESCRIPTION OF THE PREFERRED EMBODIMENTS

Briefly reviewing the invention in U.S. Pat. No. 7,355,217, a transistor device is structured such that the bulk, gate, drain, and source are all accessible from all four edges of a rectangular device. The transistor is created with a four-metal CMOS process. A bulk connection can be made with Metal1, which is all around the device. A gate connection can be made with Metal2, which is all around the device. Additionally, a drain/source connection can be made with Metal3, which is all around the device. A source/drain connection can be made with Metal4, which is all around the device. The transistor structure may be used to create an array of transistors for a high power output stage, for example, with the transistors arranged in a checkerboard pattern. The connections of each transistor are automatic by abutting edges of the transistors.

Figure 2A:
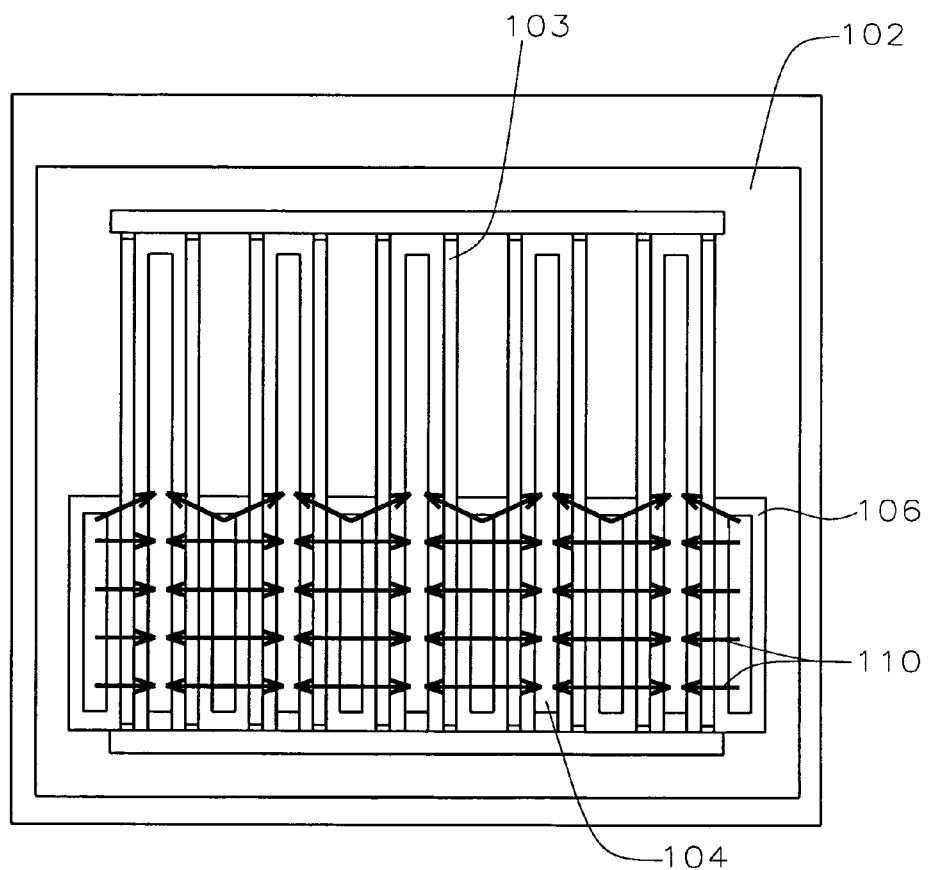
FIG. 2A schematically illustrates in top view the current distribution across a single via stripe of the related US patent.

The connection to the source/drain is by via stripes which are connected to less than half of the source/drain connection length of the single transistor finger using one via stripe only for each source/drain. For example, FIG. 2A shows a top view of Metal3 102, transistor fingers 103, and source/drain connections 104. The single via stripe 106 is connected to only the lower half of the source/drain connection length.

Since only one via stripe is used, an uneven current distribution exists over the single transistor finger and therefore over the whole transistor array. This may also cause 'hot spots' at the edge of the via stripes because the whole current which is flowing through the area of the transistor untouched by the vias is going through a single metal line. Furthermore the main current through the single transistor itself is flowing through the middle area of the transistor finger. Arrows 110 in FIG. 2A illustrate the current flow across the single via stripe.

The uneven current distribution may cause higher electromigration problems over a lifetime of the transistor device. To improve the current distribution, it is necessary to spread the current more evenly over the transistor fingers.

The present invention ensures improved current distribution by using more than one via stripe on the source/drain connection. The number of via stripes may vary from two to as much as there is space to place the vias, as long as the respective process technology rules are considered and followed.

FIGS. 4-7 illustrate an example of a transistor 100 using three via stripes for the source/drain connection. A transistor is connected with its four nodes: Gate, Drain, Source and Bulk. If a very wide transistor is defined, it can be laid out in one piece, which is very uncommon because of spacing issues and bad electrical performance (and other issues). Therefore, a wide transistor is usually laid out in multiple small pieces. This can be done using multiple small transistors, so the gates are 'multiplied'. Or it can be done with one transistor device where the gate contains several fingers. In this case, the drain/source connections of the transistor parts are shared. A 'transistor finger' is one gate of a transistor made of two or more gates when drain and/or source is shared between the fingers. The number of gate fingers also may vary with respect to the semiconductor process technology used. The example device has ten poly gate fingers.

Figure 3:
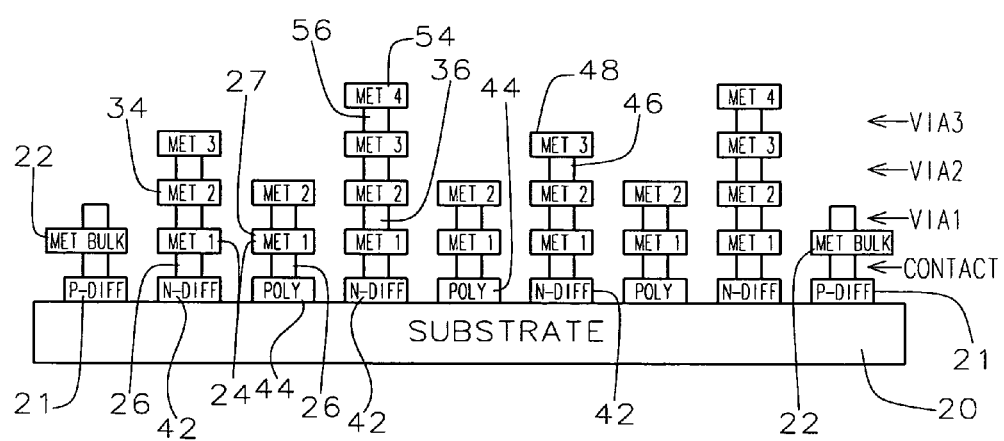
FIG. 3 schematically illustrates in cross-sectional representation a transistor in a preferred embodiment of the present invention.
Figure 4:
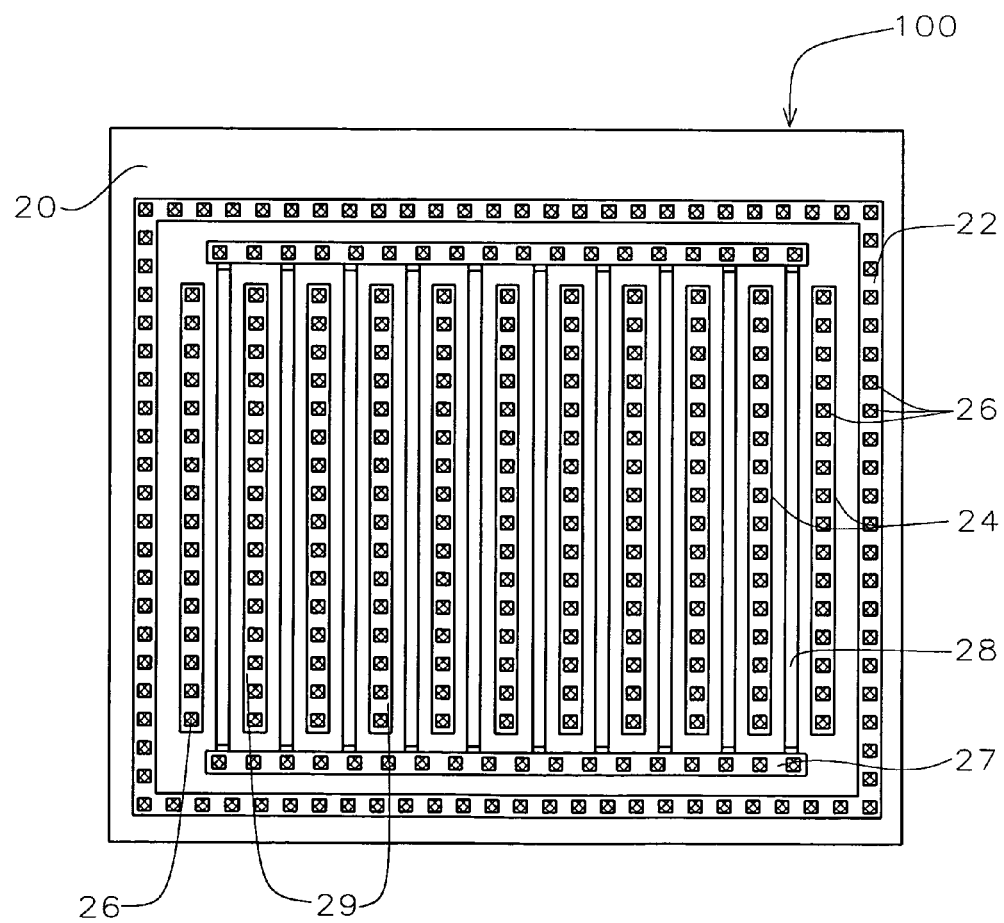
FIG. 4 schematically illustrates in top view the Metal1 view of FIG. 3 in a preferred embodiment of the present invention.

Refer now to FIG. 3 showing a cross-section of the device having three transistor fingers. Also refer to the top view FIG. 4 showing the Metal1 layer. In this figure, there are ten transistor fingers. The figures show an NMOS transistor type defined by its diffusion implants 21. If the structure is considered to be an NMOS then the BULK is made of a p-doped ring. If the structure is considered to be a PMOS then the BULK is made of an n-doped ring. It will be understood that the invention is valid for both types, NMOS and PMOS devices.

In FIG. 3, the outermost left and right Metal1 22 on top of the substrate 20 is the BULK connection all around the structure. FIG. 4 shows substrate 20. An outermost ring 22 defines the bulk connection of a single transistor structure which contains 10 fingers 28.

The center part of FIG. 3 shows the GATE connection of the transistor, defined by the POLY area. In this figure, there are three POLY areas; that is, three transistor fingers. The POLY areas are comprised of polysilicon formed on the substrate 20. To the left of the POLY is an N-diffusion, defining the Drain/Source connection of the transistor, connected by a CONTACT to Metal1, a VIA1 connecting to Metal2, a VIA2 connecting to Metal3 and a VIA3 connecting to Metal4. To the right of the POLY is an N-diffusion, defining the Source/Drain connection of the transistor, connected by a CONTACT to Metal1, a VIA1 connecting to Metal2, and a VIA2 connecting to Metal3.

In FIG. 4, ten poly fingers 28 are illustrated. Contacts 26 connect the Metal1 areas 24 to underlying diffusions 42 or polysilicon layers 44, shown in FIG. 3. Horizontal Metal1 stripes 27 define the connections to the underlying poly gate.

Vertical Metal1 stripes 29 define the alternating connections from Metal1 to the drain/source areas of the transistor. If the leftmost stripe is considered to be SOURCE, then the next stripe is DRAIN, the next is SOURCE, the next DRAIN etc. Or vice versa.

Figure 5:
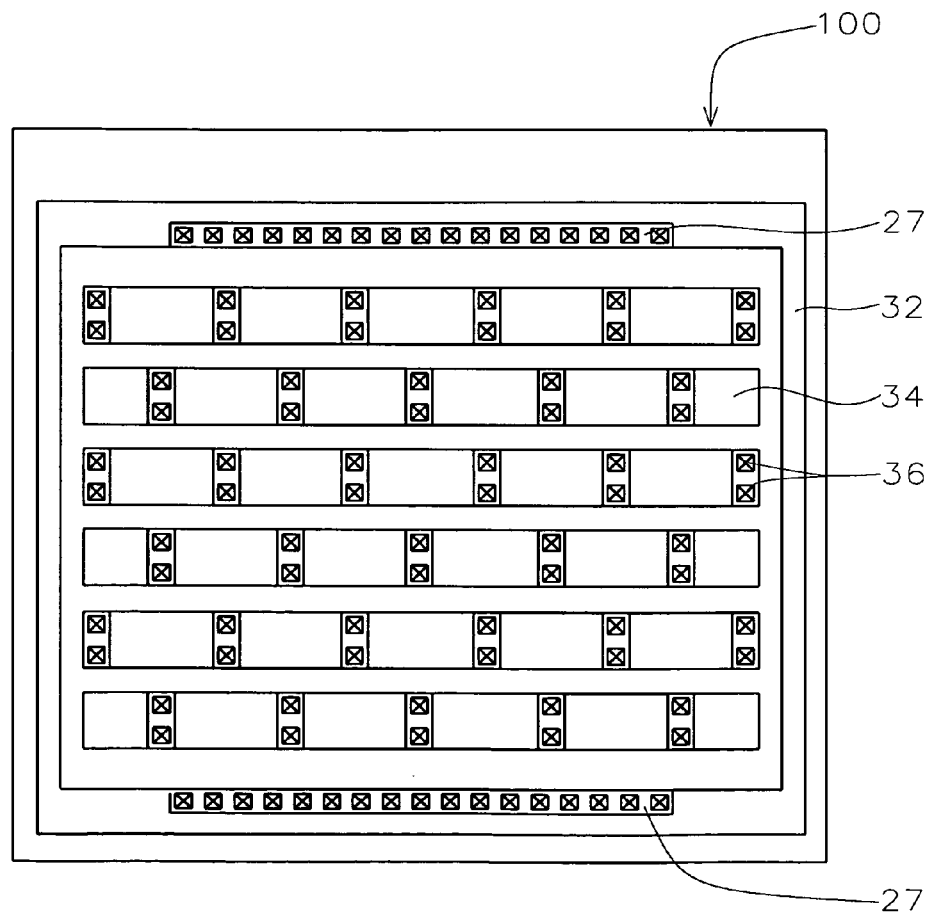
FIG. 5 schematically illustrates in top view Metal2 and connections of FIG. 3 in a preferred embodiment of the present invention.

Referring now to FIG. 5, a top view of the Metal2 layer is shown. The outermost ring 32 defines the gate connection of the transistor device. Metal2 lines 34 are shown. Contacts 36 define the connections between underlying Metal1 24 (shown in FIG. 4) and Metal2 34. These connections are referred to as Via1. The top and bottom stripes 27 of Via1 are connected to the gate fingers of the device by using Metal1 (see FIG. 4).

The horizontal Metal2 stripes 34 define the alternating connections from Metal2 to the drain/source areas of the transistor with respect to the Metal1 connections from FIG. 2.

Figure 6:
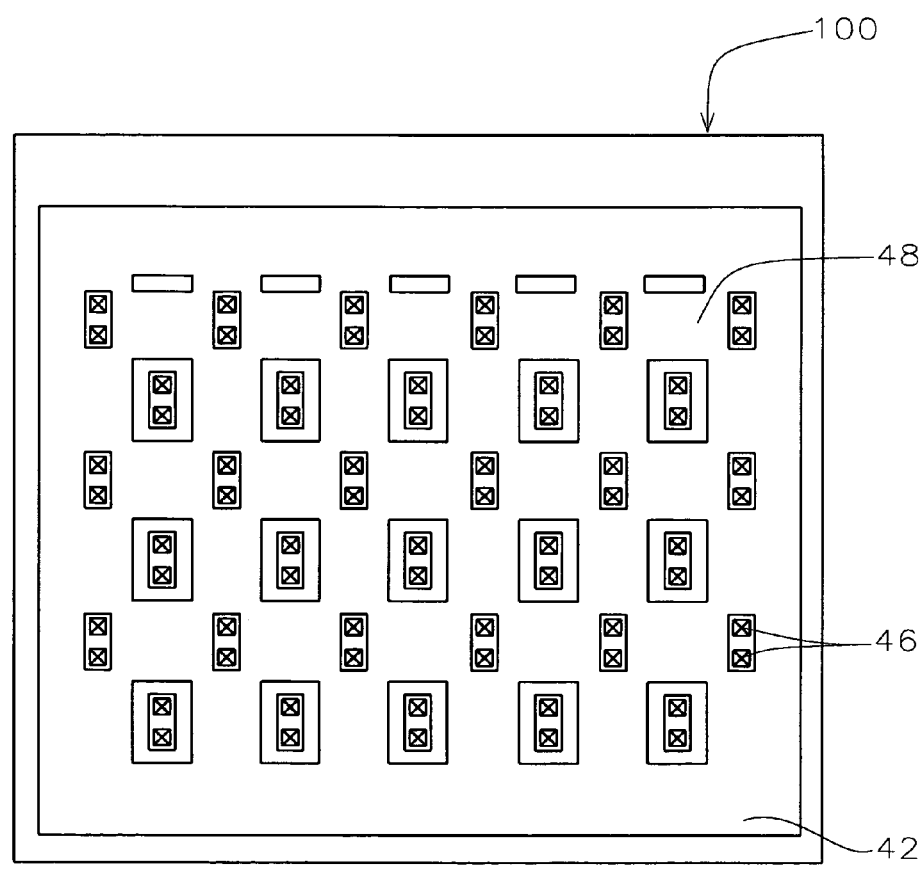
FIG. 6 schematically illustrates in top view Metal3 and connections of FIG. 3 in a preferred embodiment of the present invention.

FIG. 6 shows a top view of the Metal3 layer. The outermost ring 42 and the paths connected to the outermost ring define the drain/source connection of the transistor device. Metal3 48 is shown. Connections 46 between Metal2 and Metal3 are usually named Via2. The Via2 are connected to the drain/source areas of the device by using Metal1 and Metal2 (see FIGS. 4 and 5). The Metal3 areas 48 including their respective Via2 46 are connected to a drain or a source of the transistor device. The Metal3 areas 48, including the paths connected to the outermost ring, define the source or drain of the transistor device.

Figure 7:
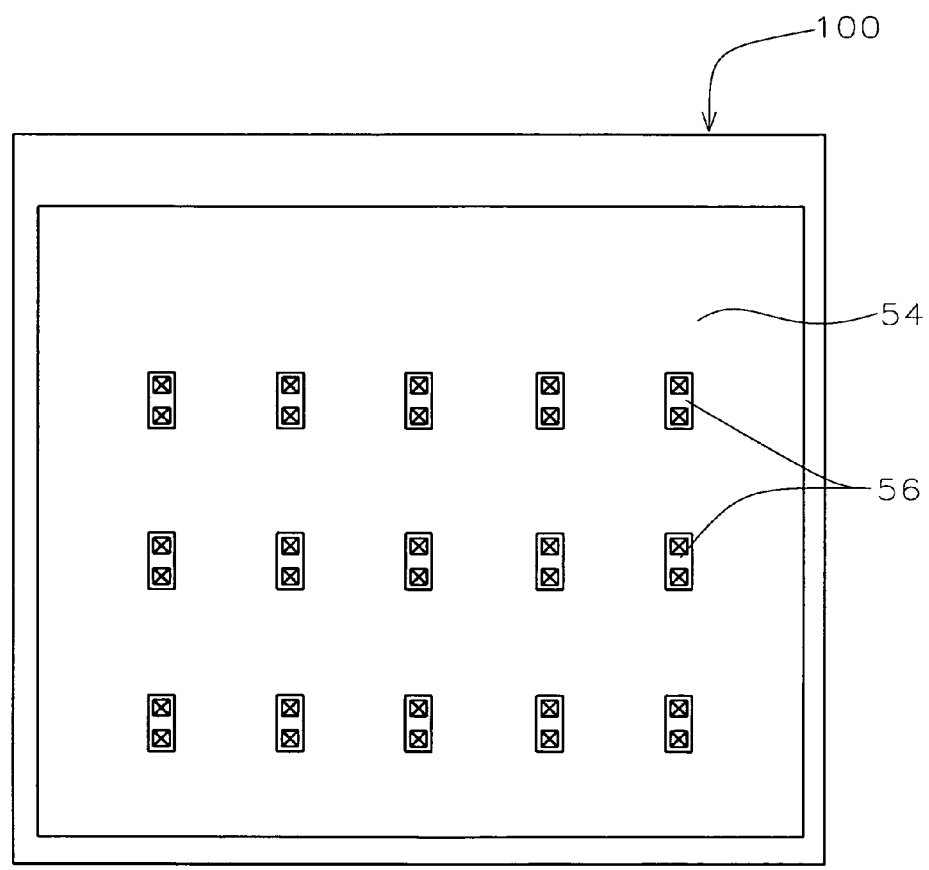
FIG. 7 schematically illustrates in top view Metal4 and connections of FIG. 3 in a preferred embodiment of the present invention.

FIG. 7 shows topmost Metal4 layer comprising the drain/source connection of the transistor device. The Metal4 area is shown as 54. Contacts 56 define the connections between Metal3 and Metal4, usually named Via3. The Via3 56 are connected to the drain/source areas of the device by using Metal1, Metal2 and Metal3 (see FIGS. 4, 5, and 6). The Metal4 area 54 including its respective Via3 is connected to the drain or source of the transistor device. The Via3 56 are connected to underlying Metal3 and therefore to the drain or source of the transistor device.

In summary, transistor 100 may be an NMOSFET, having a p-type substrate, such as p-type silicon. The n-type diffusion regions N-Diff are interchangeably usable as drain and source regions. The semiconductor region 20 between two N-Diff regions is the channel region of the transistor. Alternatively, transistor 100 may be a PMOSFET, having an n-type substrate, such as n-type silicon. In this case, p-type diffusion regions will be interchangeably usable as drain and source regions. Also, Poly may be connected to the channel region 20 through an insulator (such as silicon dioxide), not shown, that separates Poly from the channel region.

Each of the four metal layers covers all four edges of the device rectangle. The bulk connection surrounds the transistor and is accessible in Metal1. No other layer is needed to connect the bulk. The gate connection is accessible in Metal2. The Metal2 connection surrounds the whole structure. As previously stated, the drain and source are interchangeable. Metal3 may be used for the drain connection and Metal4, for the source connection. However, it is understood that, alternatively, Metal4 may be used for the drain connection and Metal3 for the source connection. In one embodiment, Metal3 is a slotted plate over the whole device. The slots are provided because of the connection to Metal4, which is the source (assuming that the drain is on the Metal3 plate). The Via3s are connected to the Metal3 paths, which are located in the slots of the Metal3 plate to connect to the source on the Metal4 plate (assuming that drain is on the Metal3 plate). The Metal4 plate is the top plate of the device and covers the whole transistor. Slots 112 can be seen, for example, in FIG. 2B.

Figure 1A:
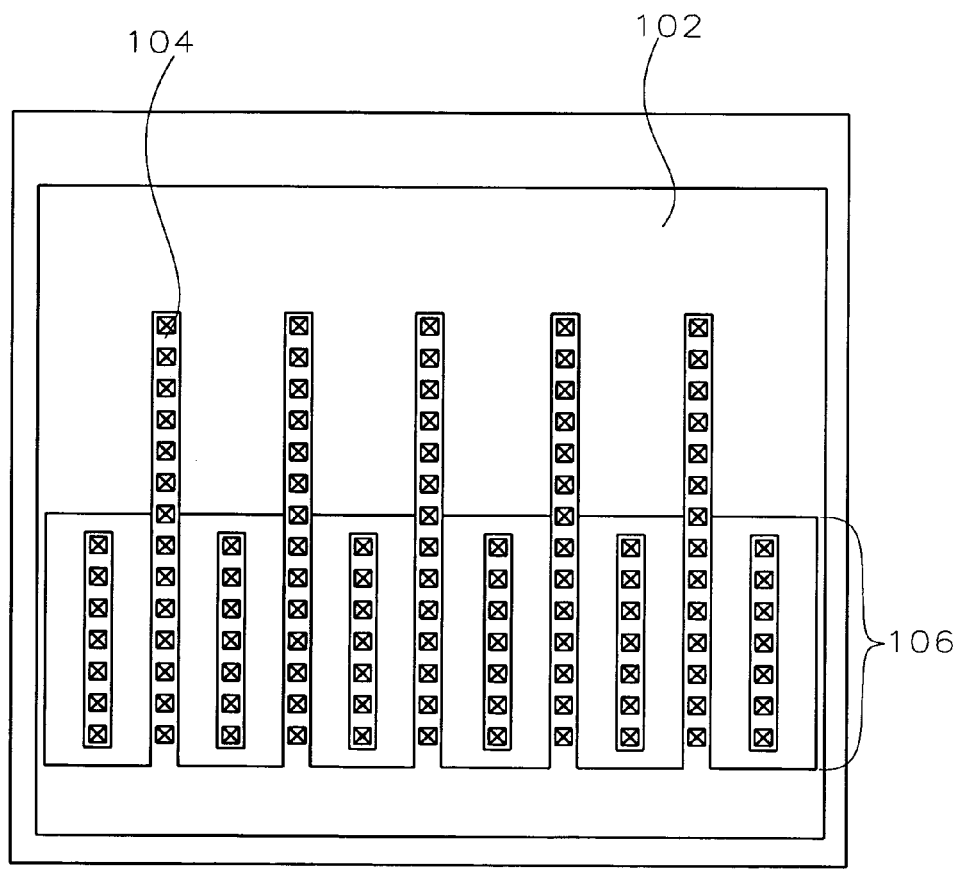
FIG. 1A schematically illustrates in top view a single via stripe of the related US patent.
Figure 1B:
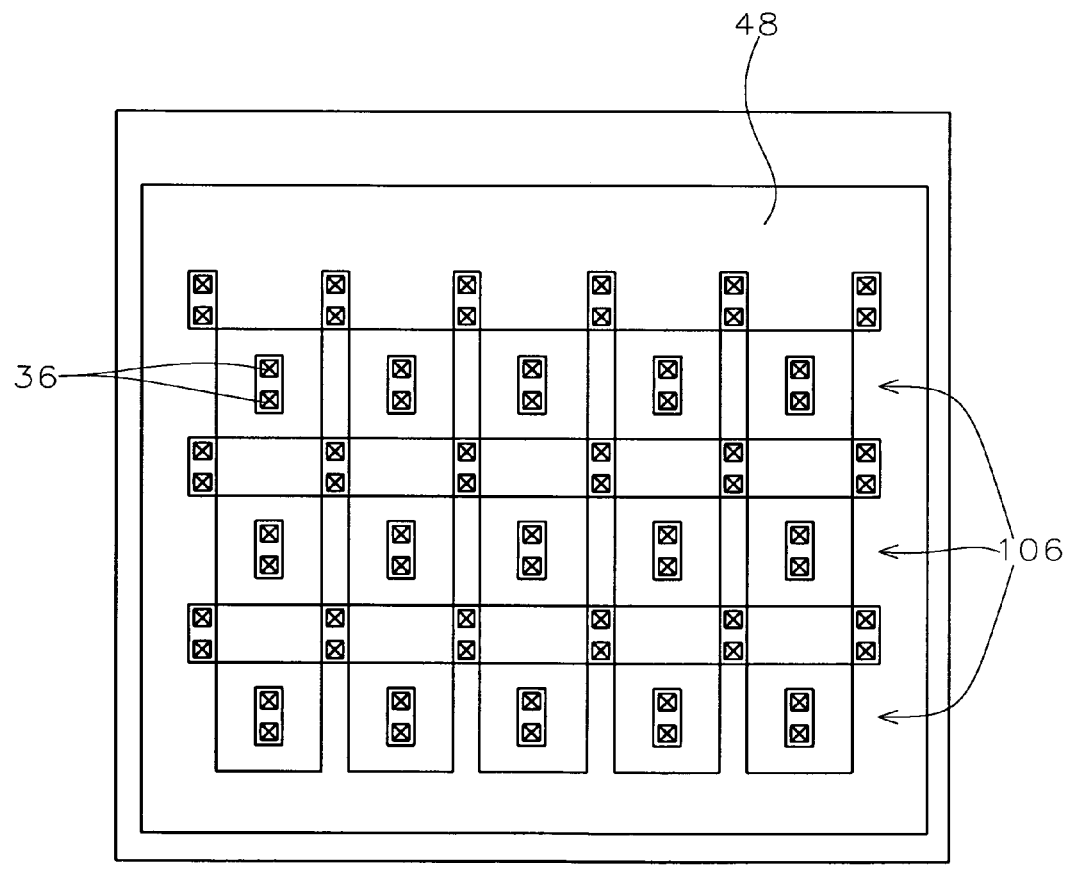
FIG. 1B schematically illustrates in top view multiple via stripes of the present invention.
Figure 2B:
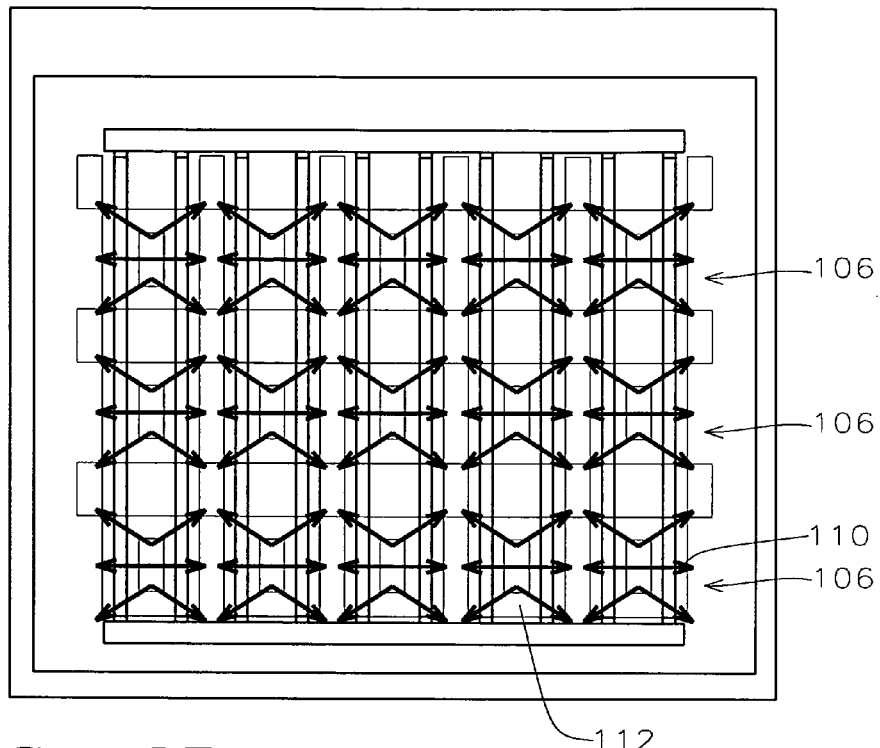
FIG. 2B schematically illustrates in top view the current distribution across the multiple via stripes of the present invention.

Referring again to FIG. 1A, it can be seen that, in the prior patent, there is only one via stripe 106 for every SOURCE or DRAIN connection of the transistor (made of 10 fingers in the example). In FIG. 1B, showing the device of the present invention, it can be seen that there are multiple via stripes 106 (made of 2 vias 36 each in this example) connecting the Metal3 48 to the horizontal stripes 34 from FIG. 5. Therefore the current distribution over the transistor fingers is much more uniform than in the old device. This is because in the old device the current comes from only half of the finger length and flows also to the second half. FIG. 2A illustrates the current flow of the prior patent by arrows 110. In the new structure, as shown in FIG. 2B, the current 110 is spread over multiple via areas 106 evenly over the device (3 via areas per transistor finger in this example), hence a much better current distribution.

Figure 8:
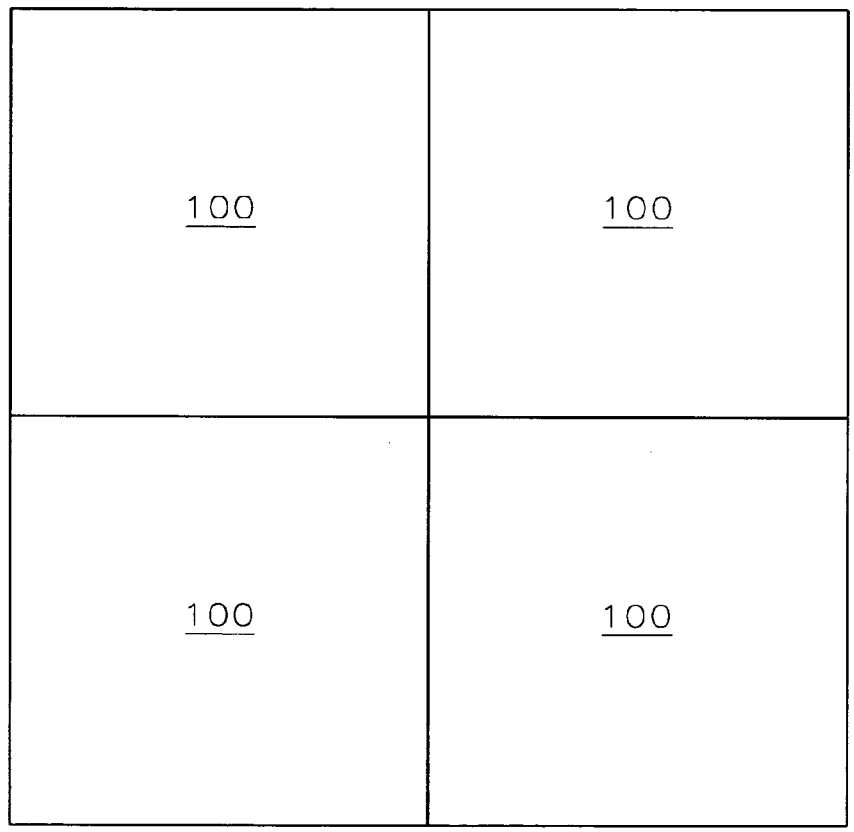
FIG. 8 illustrates a block diagram of an embodiment of an array of transistors structured according to a preferred embodiment of the present invention.

The present invention provides an array of output transistors in which the source, drain, gate, and bulk of each of the output transistors in the array is accessible from all four edges and wherein current distribution is evenly spread in the single pieces of the array. More specifically, two or more via stripes, evenly distributed over the length of the transistor fingers connect the source/drain parts of the transistor fingers. FIG. 8 illustrates an array of transistors 100, as shown in FIGS. 4-7. The connections of each transistor are automatic by abutting edges of the transistors, as shown in FIG. 8. It will be understood that any number of transistors can be formed in an array such as is shown in FIG. 8.

While the invention has been particularly shown and described with reference to the preferred embodiments thereof, it will be understood by those skilled in the art that various changes in form and details may be made without departing from the spirit and scope of the invention.

What is claimed is:

1. A transistor device laid out in a CMOS process, shaped as a rectangle having four edges, comprising:
    a first drain/source layer that is employable as a source or a drain connection layer;
    a top drain/source layer that is employable as a source or a drain connection layer, wherein said top drain/source layer is above said first drain/source layer, and wherein both of said first drain/source layer and said top drain/source layer covers each of said four edges of said device rectangle, such that both of said drain and said source are accessible from each of said four edges of said device rectangle;
    two or more via stripes extending over an entire length in an X direction and evenly distributed over an entire length in a Y direction connecting said first drain/source layer and said top drain/source layer;
    a gate layer that is employable as a gate connection layer; and
    a bulk layer that is employable as a bulk connection layer, wherein the bulk is independently accessible from the drain, the gate, and the source.

2. The transistor device of claim 1, wherein said first drain/source layer and said top drain/source layer are both metal layers.

3. The transistor device of claim 1, wherein said gate layer is connected to a plurality of polysilicon gates in said X direction underlying said gate layer wherein said polysilicon gates are transistor fingers wherein said transistor fingers extend over an entire length of said rectangle in said Y direction.

4. The transistor device of claim 3 wherein said via stripes are evenly distributed over a length of said transistor fingers in said Y direction.

5. The transistor device of claim 1, wherein said first drain/source layer, said top drain/source layer, said gate layer, and said bulk layer are all metal layers.

6. The transistor device of claim 5, wherein
    said bulk layer is a Metal 1 layer that is below said gate layer, said first drain/source layer, and said top drain/source layer;
    said gate layer is a Metal 2 layer that is below said first drain/source layer and said top drain/source layer; and
    wherein said first drain/source layer is a Metal 3 layer that is below said top drain/source layer.

7. The transistor device of claim 1, wherein
    said transistor device is a transistor array including a plurality of transistors;
    said first drain/source layer is connected to said drain or said source of each transistor of a plurality of transistors;
    said top drain/source layer is connected to said drain or said source of each of said plurality of transistors;
    each transistor in said plurality of transistors is shaped as a rectangle having four edges;
    each of said transistors in said plurality is structured such that any two transistors having any two edges abutting each other automatically have their gates, drains, sources, edges, and bulks coupled together; and
    wherein, for each of said transistors in said plurality, at least one edge of said transistor is abutted to at least one of said edges of at least one of another of said transistors in said plurality of transistors.

* * * * *